United States Patent [19]

Osada et al.

[11] Patent Number: 5,451,817
[45] Date of Patent: Sep. 19, 1995

[54] SEMICONDUCTOR-MOUNTING HEAT-RADIATIVE SUBSTRATES, A METHOD OF MAKING AND USE THEREOF IN SEMICONDUCTOR PACKAGES

[75] Inventors: Mitsuo Osada; Kenichiro Kohmoto, both of Hyogo, Japan

[73] Assignee: Sumitomo Electric Industries, Ltd., Osaka, Japan

[21] Appl. No.: 181,313

[22] Filed: Jan. 13, 1994

Related U.S. Application Data

[60] Division of Ser. No. 87,073, Jul. 7, 1993, Pat. No. 5,305,947, which is a continuation of Ser. No. 770,430, Oct. 3, 1991, abandoned.

[30] Foreign Application Priority Data

Oct. 26, 1990 [JP] Japan ................... 2-290092

[51] Int. Cl.⁶ .............. H01L 23/58; H01L 29/66; G01T 1/24
[52] U.S. Cl. ................... 257/712; 257/720
[58] Field of Search .............. 257/712, 720, 746, 699, 257/706, 708, 712, 675

[56] References Cited

U.S. PATENT DOCUMENTS

| | | | |
|---|---|---|---|
| 4,792,878 | 12/1988 | Buselmeier et al. | 257/718 |
| 4,879,588 | 11/1989 | Ohtsuka et al. | 257/700 |
| 5,045,922 | 9/1991 | Kodama et al. | 257/712 |
| 5,055,914 | 10/1991 | Shimizu et al. | 257/697 |
| 5,150,280 | 9/1992 | Arai et al. | 257/678 |

*Primary Examiner*—Sara W. Crane
*Assistant Examiner*—Jhihan Clark
*Attorney, Agent, or Firm*—Wenderoth, Lind & Ponack

[57] ABSTRACT

A method for manufacturing heat-radiative substrates on which semiconductor devices such as ICs and transistors are mounted and packages using the substrates, wherein a plurality of CuW or CuMo composite materials obtained by the infiltration method or the mixed powder sintering method are joined together with Cu interposed therebetween. Accordingly, the remaining empty holes within the CuW or CuMo materials are filled sufficiently with Cu, allowing high-quality packages having a successful thermal characteristic to be obtained.

7 Claims, 5 Drawing Sheets

SEMICONDUCTOR-MOUNTING HEAT-RADIATIVE SUBSTRATES, A METHOD OF MAKING AND USE THEREOF IN SEMICONDUCTOR PACKAGES

This application is a divisional application of Ser. No. 08/087,073 filed Jul. 7, 1993, now U.S. Pat. No. 5,305,947 which in turn is a continuation of abandoned application Serial No. 07/770,430, filed Oct. 3, 1991, now abandoned.

BACKGROUND OF THE INVENTION

1. Field of the Invention

The present invention relates to a method for manufacturing semiconductor-mounting heat-radiative substrates in which a plurality of CuW or CuMo composite metal alloys having different compositions are joined together with Cu interposed therebetween and further relates to semiconductor packages using the substrates.

2. Description of the Prior Art

In the last few years, an increase in operating speed and degree of integration of ICs, transistors and the like as well as an increase in their capacity has involved increasing amounts of heat generated by semiconductor devices. As a result of this, it matters to a great extent how generated heat is eliminated and the devices are cooled to accomplish successful operation thereof. In terms of cooling devices, there is a similar problem also in parts related to semiconductor lasers. In order to solve this problem, composite materials formed of combinations of Cu and W, or Cu and Mo have recently come into practical use as heat-radiative substrates for mounting devices in packages in which semiconductors are accommodated.

These composite materials are manufactured by some methods, for example, (a) in which Cu melted in a reducing atmosphere is infiltrated into a porous product obtained by sintering W or Mo powder (as disclosed in Japanese Patent Laid-Open Publication No. 59-21032), and (b) in which W or Mo powder is mixed with Cu powder and moreover the result is sintered in a reducing atmosphere (hereinafter, referred to as mixed powder sintering method).

FIGS. 7 and 8 are sectional views showing typical constructions of conventional IC ceramic packages in which the above-described composite materials are used as heat-radiative substrates; and FIGS. 9 and 10 are sectional views showing constructions of such packages for use with transistors.

In FIGS. 7 and 8, designations are as follows: 21 denotes a substrate composed of CuW or CuMo; 22 denotes a multi-laminated ceramic substrate composed of, for example, $Al_2O_3$ layers; 23 denotes an Si semiconductor device mounted on the substrate 21; 24 denotes a covar (Fe-29%Ni-17%Co) lead wire; 25 denotes a bonding wire; and 26 denotes a package composed of covar or $Al_2O_3$.

The construction shown in FIG. 8 is such that the Si semiconductor device 23 mounting portion 21a of the substrate 21 is higher than the construction in FIG. 7. Accordingly, the terminal mounting portion 27 of the multi-laminated ceramic substrate 22 can be flush with the Si semiconductor device 23, thus advantageous for mounting devices.

The number of laminates of ceramic substrates is recently increasing with increasing capacity of ICs; the demand for such constructions is therefore increasing more and more.

Conventional transistor-oriented packages are now described, referring to FIGS. 9 and 10. In FIG. 9, on a BeO circuit substrate 28 in the center of a CuW or CuMo substrate 21 there is mounted an Si semiconductor device 23. In FIG. 10, on the other hand, as is the usual case for use with FETs (Field Effect Transistors) employing GaAs transistors as devices 29, a GaAs transistor device 29 is directly mounted to a protrusive portion 21b provided on a CuW or CuMo heat-radiative substrate 21 having a good heat conductivity and the device can be wired with a circuit 31 provided on an insulating ceramic substrate 30 in the vicinity of the device so as to be flush with the circuit, which type of construction is thus preferred.

The substrates 21 used in the packages shown in FIG. 7 and FIG. 9 out of the above-described ones are simple flat plates which do not involve much difficulty in manufacture thereof, whereas the stepped substrates partly having protrusions 21a and 21b as shown in FIG. 8 and FIG. 10 involve various problems on manufacture thereof.

These stepped substrates are manufactured, in general, by leaving protrusive portions on a sheet of flat plate and removing the remains thereof by cutting or grinding.

This method, however, is wasteful in material to be cut and, what is more, burdened with cost for cutting tools due to the fact that its substrate material is of combination of Cu, which is a soft material, and W or Mo, which is a hard, difficult-to-cut material, and therefore the cutting tools are unavoidably subject to intermittent cutting, with the result of their greatly worn edges, which requires cutting tools to be frequently exchanged to obtain high precision and suppress any after-processing machining distortions.

On the other hand, it is possible to provide these stepped substrates by taking the above-described methods, that is, by the infiltration method (a) that Cu is infiltrated into a stepped, sintered product of W or Mo or by the mixed powder sintering method (b) that mixed powder of W or Mo and Cu is molded into a stepped shape and then sintered. However, these methods are accompanied by the following problems.

The substrate 21 used for a package having such a configuration as shown in FIG. 8 is shaped as shown in FIG. 11, where the surface 33 brazed to the ceramic substrate 22 is larger in area than the surface 32 on which the semiconductor device 23 is mounted. The surface 33 is often required to be as thin as 0.3 to 0.5 mm, normally.

Accordingly, in manufacturing such substrates by cutting off a flat plate so as to leave a protrusive portion thereof, the area of the part to be cut off is large and, when the edge of the cutting tool is worn, the mounting surface 33 is deformed due to machining distortion in cutting, thus often encountering an obstacle in brazing it with the ceramic substrate 22.

Some other methods may be available to manufacture these substrates. For example, one method is that W or Mo powder is molded by die-pressing into a stepped shape similar to the foregoing one and Cu is infiltrated into a porous product obtained by sintering the molding result (the infiltration method). Another is that mixed powder of W or Mo powder and Cu powder is molded by die-pressing into a stepped shape similar to the foregoing one and the result is sintered (the mixed powder sintering method). However, as described above, in the shape of FIG. 11, the surface 33 to be brazed with the ceramic substrate 22 is thin such that a die-pressing result having the same density as the semiconductor-device mounting surface 32 is difficult to obtain. Moreover, even if a die-pressing result having the same density is obtained, the brazed surface 33, which forms the thin-wall portion of the die-pressing result, is low in strength, thus difficult to treat.

In addition, in order to obtain composite materials having no defects (empty holes), high-temperature treatment over the melting temperature of Cu is necessitated as the baking temperature. In order to fill empty holes sufficiently with Cu, excessive Cu needs to be added for baking, which causes the baking result to be covered in its surface with Cu. Accordingly, some countermeasure must be taken to remove the resulting Cu, requiring labor equivalent to that in manufacturing the substrates from flat plates by cutting.

Next, the heat-radiative substrate 21 used for transistor-oriented packages, having a sectional configuration as shown in FIG. 10, is shaped as shown in FIG. 12, where the protrusive portion 21b on which the GaAs transistor device 29 is mounted is much smaller than the flat portion 34.

Therefore, it is difficult to manufacture a die for press-forming such a protrusive portion and to charge powder into the die for die-pressing, involving some problems in manufacturing.

As a method for manufacturing such a stepped substrate, such one is available that the protrusive portion and the flat portion are separately prepared, subjected to Ni plating (to ensure the wetting of brazed material in brazing), and brazed along with the ceramic portion in manufacturing ceramic packages to obtain packages such as shown in FIG. 13. However, in this case, it is difficult to take a constant interval of a semiconductor-device mounting substrate 35 to a ceramic portion 36, and moreover, due to empty holes remaining within a brazing material 37 which is the joint surface between the substrates 35 and 36 and due to the intervening brazing material 37 having a low heat conductivity, heat conduction will adversely be affected. This will cause quality deviations of packages, disadvantageously.

SUMMARY OF THE INVENTION

The inventors made every effort to solve the foregoing problems of the prior arts in obtaining the above-described stepped substrates and packages with the substrates assembled therein, and thus have achieved the present invention.

Accordingly, the object of the present invention is to provide a method for manufacturing semiconductor-mounting heat-radiative substrates in which a plurality of CuW or CuMo composite metal alloys obtained by the infiltration method or the mixed powder sintering method are joined with Cu interposed therebetween and further provide semiconductor packages using the resulting substrates.

According to the method of manufacturing a heat-radiative substrate A of the present invention, a flat plate 1 serving as the stepped protrusive portion, as shown in FIG. 1, and a flat plate 2 forming the flat portion are separately prepared.

As a method for preparing them, W or Mo powder is molded, then melted Cu is infiltrated in a reducing atmosphere into empty holes of a porous product obtained by sintering the result (the infiltration method), and the resulting composite metal alloy of W or Mo and Cu is ground into the flat plates 1 and 2. Next, with a thin Cu foil pinched between these flat plates, they are joined together in a reducing atmosphere while the temperature is kept higher than the melting temperature of Cu.

In this process, the melted Cu foil melts with the Cu contained in the composite metal alloy, excessive part thereof being press-formed out of the joint surface. As a result, on the joint surface having been cooled, there is only an extremely thin Cu layer left, thus not affecting the uniformity of thermal expansion all over the joint substrate A. Moreover, since Cu has a good heat conductivity and a melting point (1080°C.) higher than the brazing material used for joining ceramic substrates in assembling packages (generally, eutectic brazing material, brazing temperature: 750° to 900° C.), it is possible to provide substrates which have a thermal characteristic comparable to that ground out from an integral material and which can be assembled by brazing.

Incidentally, the remaining empty holes of the joint surface, which is in question, are free from any defects as in the inside of the metal alloy manufactured by the infiltration method, since the melted Cu foil and Cu contained in the composite metal alloy are integrated together so that the excessive part thereof covers the entire joint surface, thus excluding any problems.

Furthermore, by the method in which W or Mo powder is mixed and molded with Cu powder, treated at a temperature over the melting temperature of Cu to obtain a composite metal alloy (the mixed powder sintering method), a composite metal alloy having less defects (i.e. empty holes) is not satisfactorily obtained. However, when such a metal alloy resulting from the above method is employed as a material for obtaining heat-radiative substrates of the present invention, Cu melted in joining will cover the remaining empty holes within the material, thus the resulting heat-radiative substrate after joint showing less defects (empty holes) enough to serve as the material.

The method of the present invention is advantageous not only in saving the materials for the composite metal alloys to be used and reducing the costs for the cutting process and the tools due to reduction in cutting-processed margins but also in capability of making a number of shapes by combinations by means of preparing simple standard dies. Thus, it is suitable for manufacturing such products which are critical to meet the need for various-type, small-lot production.

The method of the present invention can provide substrates having the following advantages on performance in addition to the above-described ones on manufacture.

According to the joining method of the present invention, it is possible to vary the composition ratio of materials combined thereby to make substrates having such characteristics that cannot be provided by the method of grinding out them from a single material by cutting.

CuW or CuMo composite metal alloys have the following characteristics depending on their composition.

In principle, the higher the content ratio of Cu in a composite metal alloy, the better the heat conductivity and the better the heat radiation characteristic; for use as package substrates, selections of composition ratio as shown below are available depending on the type of insulating materials and electrically conductive materials to be used in combination:

As an example, a composite material of Cu: W=10:90 (by weight) has a thermal expansion ratio that approximates that of alumina ceramics, thus the composite material is most suitable for heat-radiative substrates brazed with alumina ceramics.

Another of Cu: W=15:85 (by weight) has a thermal expansion ratio that approximates that of beryllia ceramics, thus used for FET-oriented ceramic packages in which Si devices are accommodated.

A CuMo composite metal alloy, although its heat conductivity is inferior to that of CuW composite materials, is small in specific gravity, thus suitable for use as substrates for large-sized packages.

As seen above, thermal characteristics (heat conductivity and thermal expansion ratio) differ depending on the composition ratio. Accordingly, if a single material is used, all the characteristics cannot be satisfied as heat-radiative substrates for use in packages.

By contrast, according to the present invention, a plurality of required characteristics can be satisfied as follows.

In general, used as substrates for use in Si FET-oriented ceramic packages, where good thermal and insulating characteristics are required, are ceramic packages of such a construction that $Al_2O_3$ is used as the multilayer insulating ceramic substrate 22 of outer walls and BeO is used as the heat-radiative insulating circuit substrate 28 on which the semiconductor device 23 is mounted, as shown in FIG. 9.

In this case, the $Al_2O_3$ and the BeO circuit substrate 28 differing from each other in thermal expansion ratio as outer walls are necessarily simultaneously joined with the CuW substrate 21 by brazing. Accordingly, in order to prevent the two materials 22 and 28 from damage due to thermal distortion in cooling subsequent to brazing and prevent the CuW substrate 21 from deformation, the composition ratio is fine adjusted depending on design configuration such as Cu: W=13:87 or Cu: W=15:85; however, this cannot serve as satisfactory settlements for problems involved.

On the other hand, according to the method of the present invention, it is possible to make CuW composite metal alloys formed of combinations of materials having different ratios of Cu to W, such as Cu: W=20:80 for the flat plate 1 and Cu: W=10:90 for the flat plate 2, as shown in FIG. 1. As a result, even though two types of materials of $Al_2O_3$ and BeO are brazed at the same time, problems of damage and deformation thereof due to thermal distortion can be solved.

It is to be noted here that the combinational substrates of different composition ratios made by the method of the present invention have a soft Cu thin layer existing between the two materials, and this thin layer serves as a buffer layer so that almost no deformation will occur due to the difference in thermal expansion ratios of the two materials.

In a heat-radiative package as shown in FIG. 2, when a ceramic circuit substrate 3 of $Al_2O_3$ or the like is soldered with the flat plate 2 within the package, it is preferable to use a CuW base metal from the viewpoint of thermal expansion, but this will add weight thereto and therefore CuMo base metals have conventionally been used. This being the case, according to the present invention, it is allowed to combine CuMo material as the flat plate 2 and CuW material as the flat plate 1 with a Cu joint 4, as shown in FIG. 3, thus permitting the making of packages which are lightweight and suitable for joining with the ceramic circuit substrate 3 of $Al_2O_3$ or BeO.

In addition, in FIGS. 2 and 3, reference numeral 5 denotes an outer frame made of covar or the like, 6 denotes a covar lead wire, and 7 denotes a glass seal.

BRIEF DESCRIPTION OF THE DRAWINGS

These and other objects and features of the present invention will become apparent from the following description taken in conjunction with the preferred embodiments thereof with reference to the accompanying drawings, in which.

DETAILED DESCRIPTION OF THE PREFERRED EMBODIMENTS

The present invention is now described below in detail by way of preferred embodiments thereof.

Embodiment 1

Mixed powder in which camphor was mixed as an organic binder at a mixing ratio of 2% by weight with W powder was filled to a die, which was then pressed to obtain a die-pressed product. This die-pressed product was heated at 500° C. in a hydrogen atmosphere to evaporate the camphor away, and sintered at 1400° for 2 hours. Thus, a W porous product was obtained.

Subsequently, a Cu plate having enough weight to fill the holes of the resulting porous product was overlaid thereon and heated at 1200° C. in a hydrogen atmosphere, and Cu was melted and infiltrated into the holes of the porous product. Thus, W and Cu composite metal alloys were obtained which had a ratio of Cu: W=10:90 (by weight) with their 10 mm×10 mm×1 mm and 30 mm×30 mm×0.5 mm peripheral surfaces covered with Cu.

Both surfaces of these composite metal alloys were ground and their peripheral end surfaces were cut to remove Cu. Thus, 9 mm×9 mm×0.8 mm and 29 mm×29 mm×0.3 mm flat plates 1 and 2 were obtained.

Figure 6:
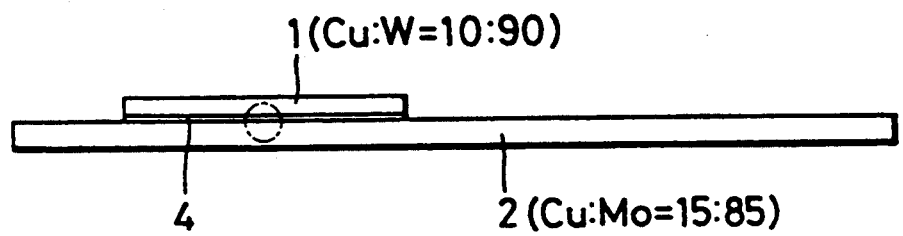
Figure 7:
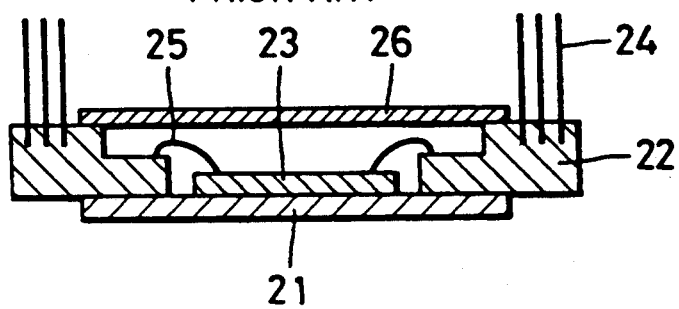
FIGS. 7 through 10 and FIG. 13 are sectional views of semiconductor packages using conventional heat-radiative substrates.
Figure 8:
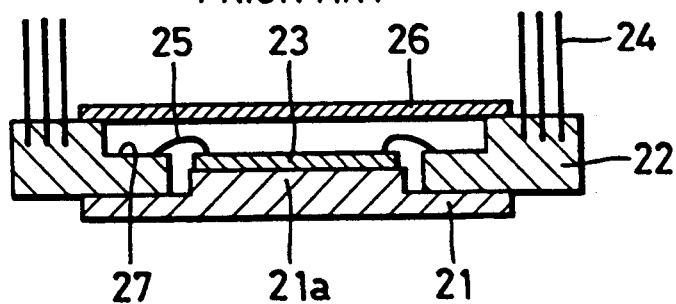
Figure 9:
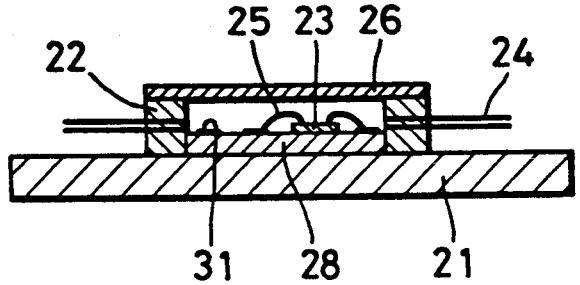
Figure 10:
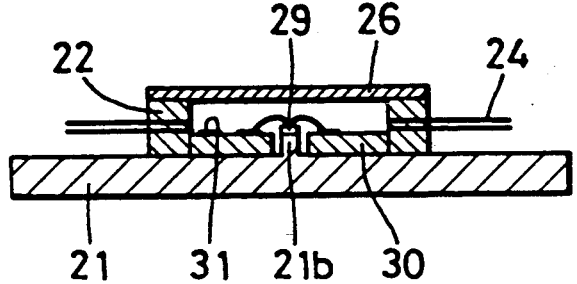
Figure 11:
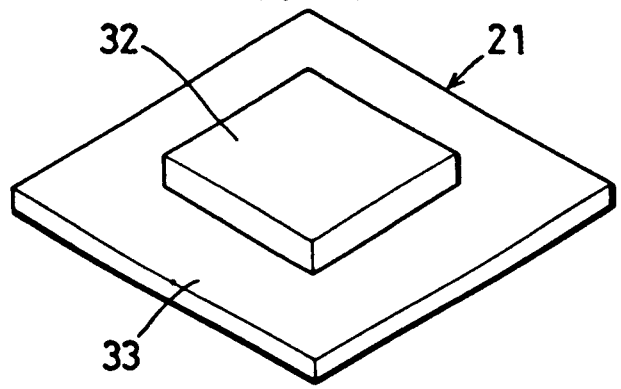
FIGS. 11 and 12 are explanatory views showing the constructions of conventional heat-radiative substrates.
Figure 12:
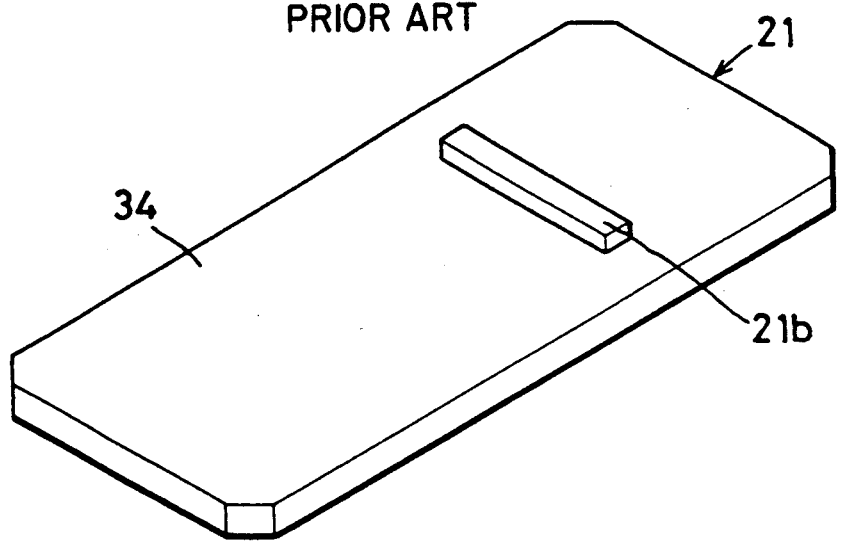
Figure 13:
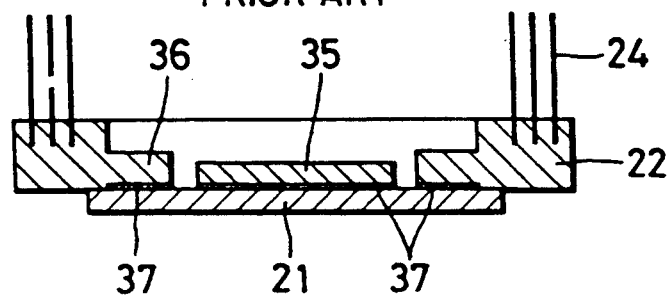

Between the resulting two flat plates 1 and 2, a 9 mm×9 mm×0.1 mm Cu plate 4 was set within a carbon jig, and heated at 1200° C. for 10 minutes in a hydrogen atmosphere to melt Cu. Thereafter, it was cooled. Thus, a stepped heat-radiative substrates as shown in FIG. 6 was obtained. After the Cu adhering to the periphery of joint portion was cut away, it was ground by barrel finishing to eliminate the Cu adhering to the periphery.

Figure 14:
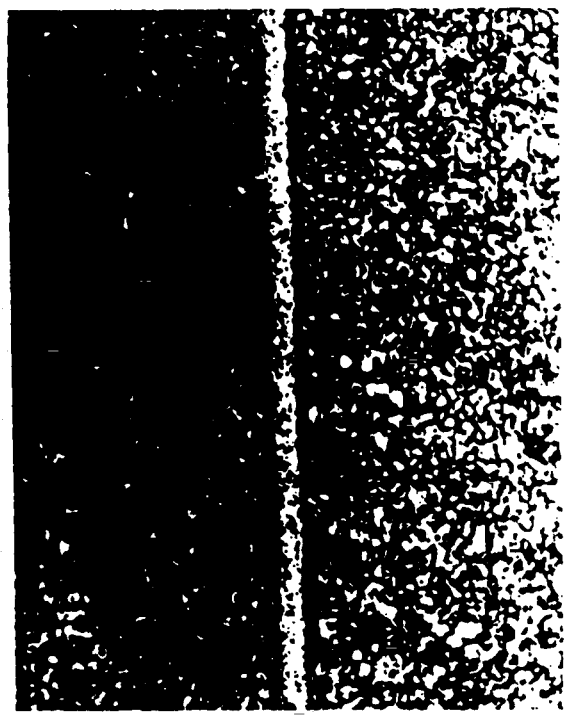
FIGS. 14 and 15 are microphotographs showing the structure of the joint surface section in the heat-radiative substrate of FIG. 6.

Looking into the microstructure of the joint portion section of the resulting substrate, it was found as shown in FIG. 14 that such empty holes were not present in the joint portion as would adversely affect heat radiation.

Figure 1:
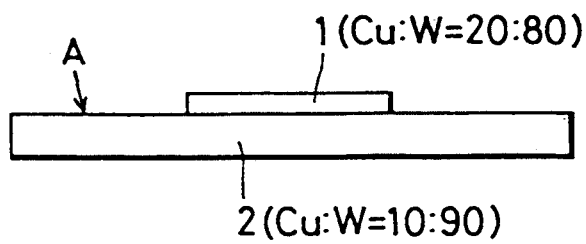
FIG. 1 and FIG. 6 are explanatory views showing the constructions of heat-radiative substrates according to the methods of the present invention.
Figure 2:
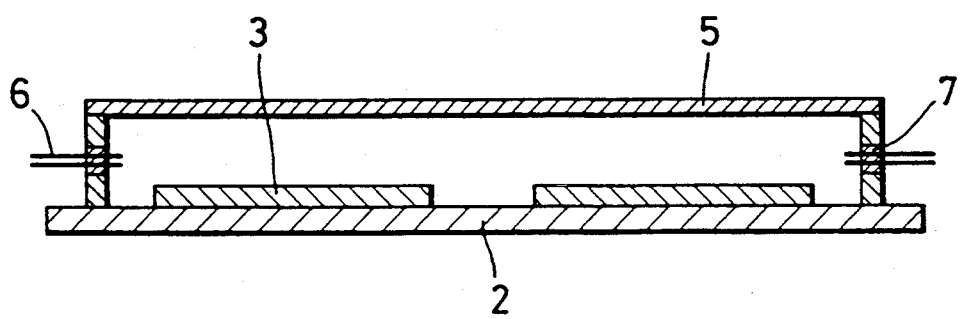
FIGS. 2 through 5 are sectional views of semiconductor packages using heat-radiative substrates of the present invention.
Figure 3:
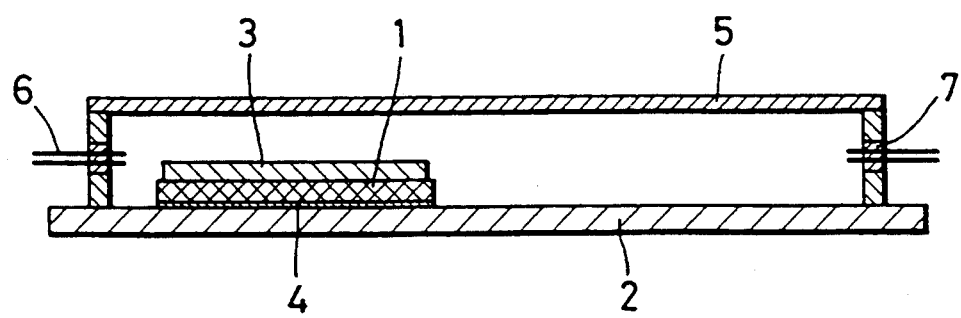
Figure 4:
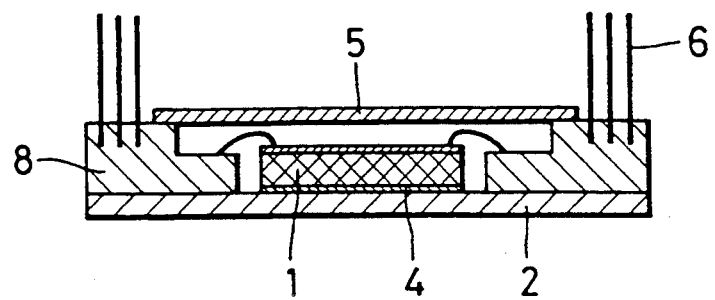

This surface was plated with Ni, and the result was joined by brazing using silver solder with an Al₂O₃ substrate 8 the joint surface of which is W metallized and Ni plated. Thus, an IC ceramic package as shown in FIG. 4 was obtained.

Embodiment 2

A flat plate 1 having a shape of 7 mm×7 mm×0.5 mm and a composition of Cu: W=20:80 and a flat plate 2 having a shape of 30 mm×11 mm×1 mm and a composition of Cu: W=10:90 were prepared by the same method as in embodiment 1.

Figure 5:
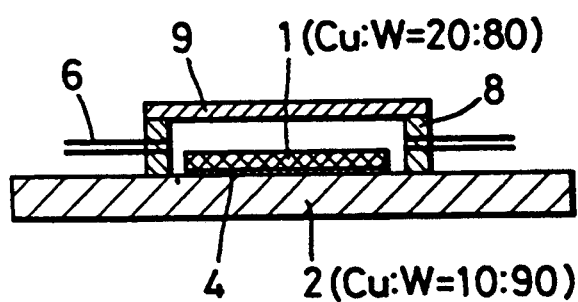

Using a stepped substrate in which a 7 mm×7 mm×0.1 mm Cu foil 4 was pinched between the above two flat plates 1 and 2 and joined by the same method as in embodiment 1, an alumina frame 8 and a beryllia plate 9 were brazed thereto at the same time, thus making an FET-oriented package as shown in FIG. 5.

The resulting package proved to have no cracking in the beryllia plate and moreover the warp of the bottom surface of the package was less than 0.002 mm. Thus, a package having a successful heat radiation characteristic was obtained.

Embodiment 3

Mixed powder in which camphor was mixed as an organic binder at a mixing ratio of 2% by weight with Mo powder was filled to a die, which was then pressed to obtain a die-pressed product.

This die-pressed product was heated at 500° C. in a hydrogen atmosphere to remove the camphor, and then sintered at 1200° C. for 2 hours in a hydrogen atmosphere. Thus, an Mo porous product was obtained.

Subsequently, Cu was infiltrated into the holes of the Mo porous product in the same manner as in embodiment b 1, so that a Cu and Mo composite metal alloy having a shape of 30 mm×60 mm×1 mm and a ratio of Cu: Mo=15:85 (by weight) was obtained. By grinding this metal alloy as in embodiment 1, a 29 mm×59 mm×0.8 mm flat plate 2 was obtained.

Further, in addition to this, a flat plate 1 of Cu: W=10:90 and 20 mm×20 mm×0.5 mm was obtained by the same manner as in embodiment 1.

With a 20 mm×20 mm×0.1 mm Cu foil pinched between the two flat plates 1 and 2, the plates were joined together by the same manner as in embodiment 1.

Since the flat plates 1 and 2 were joined together with a defect-free thin Cu layer 4 interposed therebetween as shown in FIG. 6, a heat-radiative substrate was obtained which was suitable for use with a package as shown in FIG. 5.

Figure 15:
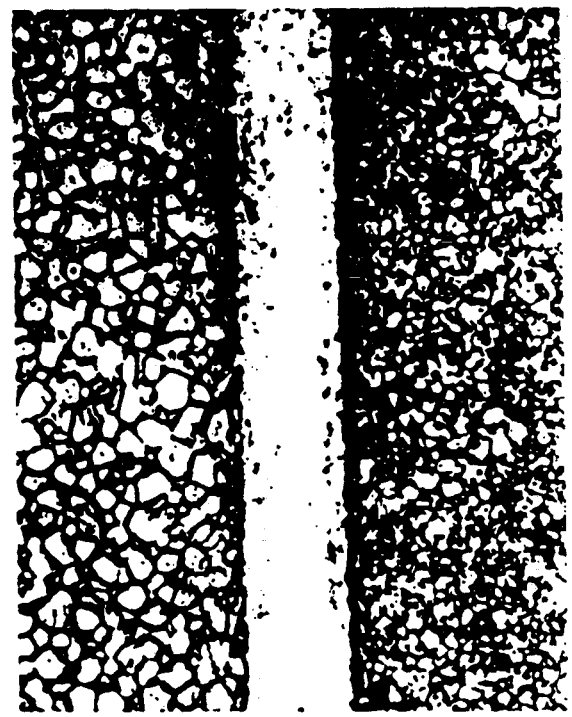

Looking into the microstructure of the joint portion section of the resulting substrate with a microscope, it was found that there were no empty holes in the joint portion such as to adversely affect heat radiation, as shown in FIG. 15.

As described above, according to the methods of the present invention, a plurality of CuW or CuMo materials having different compositions and made by the infiltration method or the mixed powder sintering method are joined together with a Cu plate or foil interposed therebetween, and as a result thereof, the remaining empty holes within the CuW or CuMo material are filled with melted Cu, thus allowing heat-radiative substrates excellent in performance to be obtained.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

What is claimed is:

1. A semiconductor-mounting heat-radiative substrate which is a joined body of a plurality of CuW or CuMo composite metal alloy portions with a pore-free Cu thin layer interposed therebetween.

2. A semiconductor-mounting heat-radiative substrate according to claim 1, wherein a plurality of CuW or CuMo composite metal alloys having different compositions are used as said CuW or CuMo composite metal alloys.

3. A semiconductor-mounting heat-radiative substrate which is a joined body of a plurality of CuW or CuMo composite metal alloy portions with a pore-free Cu thin layer interposed therebetween which is formed by joining together a plurality of CuW or CuMo composite metal alloys obtained by an infiltration method or a mixed powder sintering method, wherein Cu is disposed on an interface between said CuW or CuMo composite metal alloys and said plurality of CuW or CuMo composite metal alloys are joined together through Cu by heating them to the melting point of Cu or higher in a reducing atmosphere.

4. A semiconductor package comprising the heat-radiative substrate of claim 1 and enclosure members mounted on the substrate.

5. A semiconductor package comprising the heat-radiative substrate of claim 2 and enclosure members mounted on the substrate.

6. A semiconductor package according to claim 4, wherein the thermal expansion coefficient of the metal alloy portion of the heat-radiative substrate approximates the thermal expansion coefficient of the adjacent enclosure member.

7. A semiconductor package comprising the heat-radiative substrate of claim 2 herein the package comprises a joined body of a plurality of CuW and CuMo composite metal alloy portions with a pore-free Cu thin layer interposed therebetween and enclosure members mounted on the substrate.

* * * * *